(12) United States Patent
Huang et al.

(10) Patent No.: US 11,092,899 B2
(45) Date of Patent: Aug. 17, 2021

(54) METHOD FOR MASK DATA SYNTHESIS WITH WAFER TARGET ADJUSTMENT

(71) Applicant: TAIWAN SEMICONDUCTOR MANUFACTURING CO., LTD., Hsinchu (TW)

(72) Inventors: Hsu-Ting Huang, Hsinchu (TW); Tung-Chin Wu, Hsinchu (TW); Shih-Hsiang Lo, Hsinchu (TW); Chih-Ming Lai, Hsinchu (TW); Jue-Chin Yu, Taichung (TW); Ru-Gun Liu, Zhubei (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/698,044

(22) Filed: Nov. 27, 2019

(65) Prior Publication Data
US 2020/0174380 A1 Jun. 4, 2020

Related U.S. Application Data

(60) Provisional application No. 62/774,146, filed on Nov. 30, 2018.

(51) Int. Cl.
| | | |
|---|---|---|
| G06F 30/398 | (2020.01) | |
| G06F 30/392 | (2020.01) | |
| G03F 7/20 | (2006.01) | |
| G06F 16/23 | (2019.01) | |
| G06N 3/08 | (2006.01) | |
| G06N 3/04 | (2006.01) | |

(52) U.S. Cl.
CPC ...... *G03F 7/70441* (2013.01); *G06F 16/2379* (2019.01); *G06F 30/392* (2020.01); *G06F 30/398* (2020.01); *G06N 3/04* (2013.01); *G06N 3/08* (2013.01)

(58) Field of Classification Search
USPC .......................................... 716/53
See application file for complete search history.

(56) References Cited

U.S. PATENT DOCUMENTS

| | | |
|---|---|---|
| 8,796,666 B1 | 8/2014 | Huang et al. |
| 8,954,899 B2 | 2/2015 | Wu et al. |
| 9,093,530 B2 | 7/2015 | Huang et al. |
| 9,367,655 B2 | 6/2016 | Shih et al. |
| 9,390,217 B2 | 7/2016 | Wang et al. |
| 9,479,100 B2 | 10/2016 | Araki et al. |
| 9,548,303 B2 | 1/2017 | Lee et al. |

(Continued)

*Primary Examiner* — Bryce M Aisaka
(74) *Attorney, Agent, or Firm* — McDermott Will & Emery LLP

(57) ABSTRACT

A method for manufacturing a lithographic mask for an integrated circuit includes performing an optical proximity correction (OPC) process to an integrated circuit mask layout to produce a corrected mask layout. The method further includes performing an inverse lithographic technology (ILT) process to the corrected mask layout to enhance the corrected mask layout to produce an OPC-ILT-enhanced mask layout. The method also includes performing an inverse lithographic technology (ILT) process to the corrected mask layout to enhance the corrected mask layout to produce an OPC-ILT-enhanced mask layout.

20 Claims, 11 Drawing Sheets

(56) References Cited

U.S. PATENT DOCUMENTS

| | | |
|---|---|---|
| 9,594,862 B2 | 3/2017 | Lin et al. |
| 9,865,542 B2 | 1/2018 | Liaw et al. |
| 9,870,443 B2 | 1/2018 | Huang et al. |
| 2010/0021042 A1* | 1/2010 | Preil .......................... G03F 1/84 382/144 |
| 2014/0282290 A1* | 9/2014 | Rieger .................. G06F 30/398 716/51 |
| 2018/0341173 A1* | 11/2018 | Li .............................. G03F 1/36 |
| 2019/0147134 A1 | 5/2019 | Wang et al. |

* cited by examiner

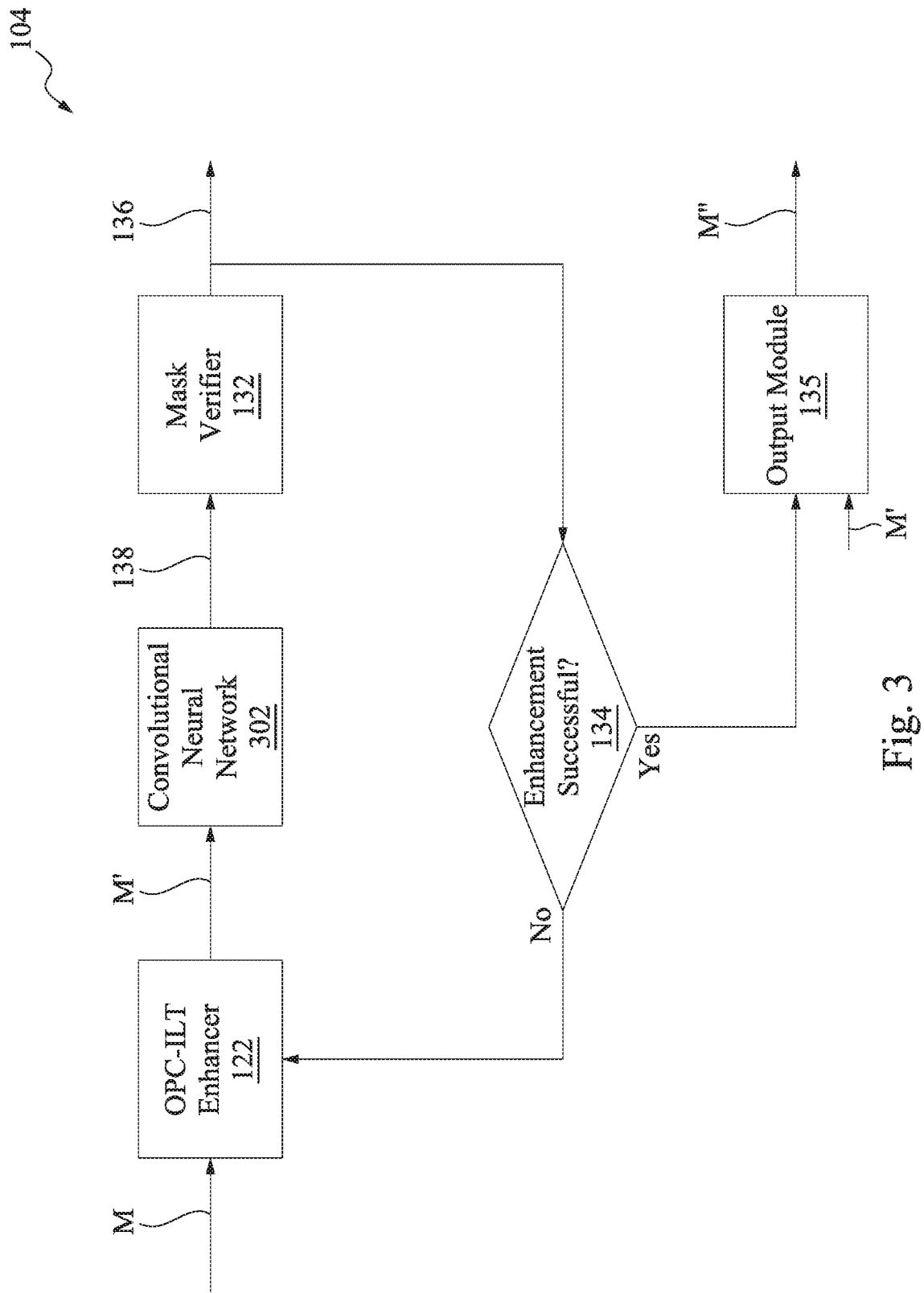

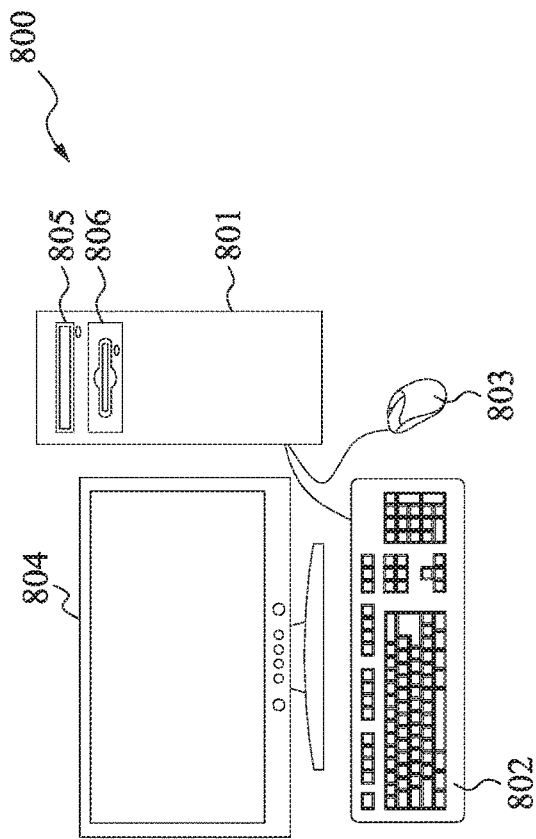
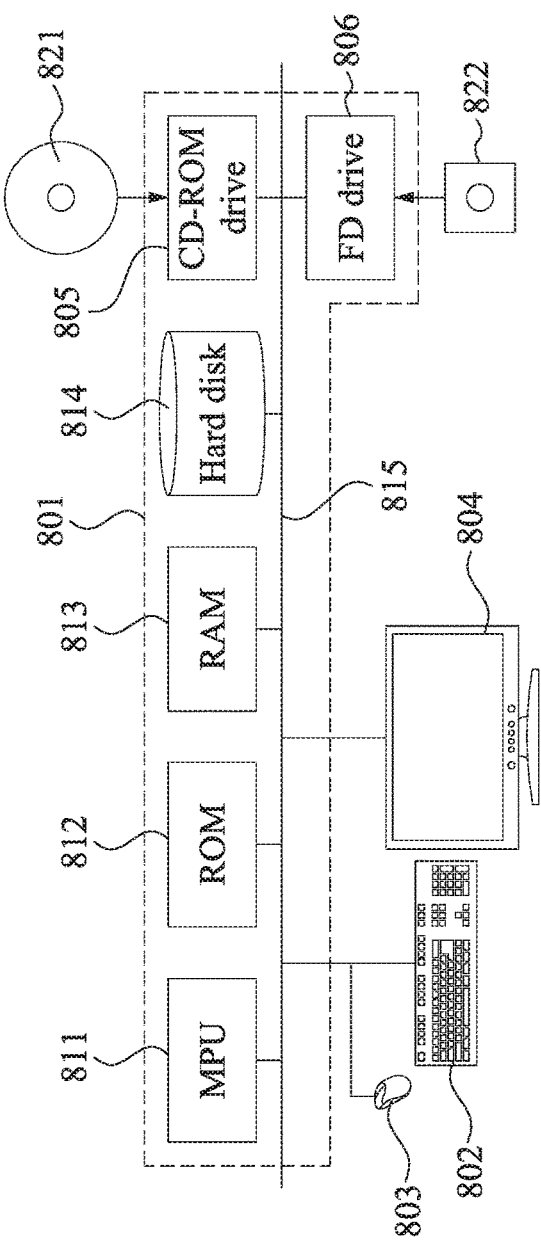
Fig. 8A
Fig. 8B

METHOD FOR MASK DATA SYNTHESIS WITH WAFER TARGET ADJUSTMENT

PRIORITY CLAIM AND CROSS-REFERENCE

This application claims priority to U.S. Provisional Application No. 62/774,146 filed on Nov. 30, 2018, entitled "Method for Mask Data Synthesis with Wafer Target Adjustment," the entire disclosure of which is incorporated herein by reference.

BACKGROUND

During an integrated circuit (IC) design, a number of IC layouts of the IC, for different steps of IC processing, are generated. The layouts include geometric shapes corresponding to structures to be fabricated on a wafer. The layouts may be mask layouts that are projected, e.g., imaged, on the wafer to create the IC. A lithography process transfers a pattern of a mask layout to the wafer such that etching, implantation, or other steps are applied only to predefined regions of the wafer. Transferring the pattern of the mask layout to the wafer may cause mask layout data defects that are a major challenge in semiconductor manufacturing. An optical proximity correction (OPC) operation may be applied to reduce photomask layout data defects.

In addition to the OPC, inverse lithographic technology (ILT), an inverse of the lithographic process, may be applied to the mask layout to compensate, e.g., correct or enhance, for the defects that may be caused by the lithographic process. The lithographic process may not be linear and the mask layout after ILT-OPC correction and enhancement may produce defects in the IC layout on the wafer and thus an extra correction to the mask layout may be generated by an iterative process. In each iteration of the extra correction, the mask layout is modified and after the modification, the mask layout is projected on the wafer to produce the IC layout on the wafer and the IC layout is checked for defects. Although the mask layout modification and the projection may be performed by simulation, the extra corrections may need several iterations of changing the ILT-OPC corrected mask layout, projecting the mask layout on the wafer, and examining the produced IC layout on the wafer for defects. Thus, extra corrections to the mask layout such that the mask layout with the extra corrections produces no defects on the wafer may take several iterations and may be very time consuming. An efficient mask layout correction process is desirable for optical and non-optical lithography.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 illustrates an exemplary process for enhancing a lithographic mask in accordance with some embodiments of the disclosure.

FIGS. 8A and 8B illustrate an apparatus for manufacturing a lithographic mask for a semiconductor circuit in accordance with some embodiments of the disclosure.

DETAILED DESCRIPTION

Figure 1:
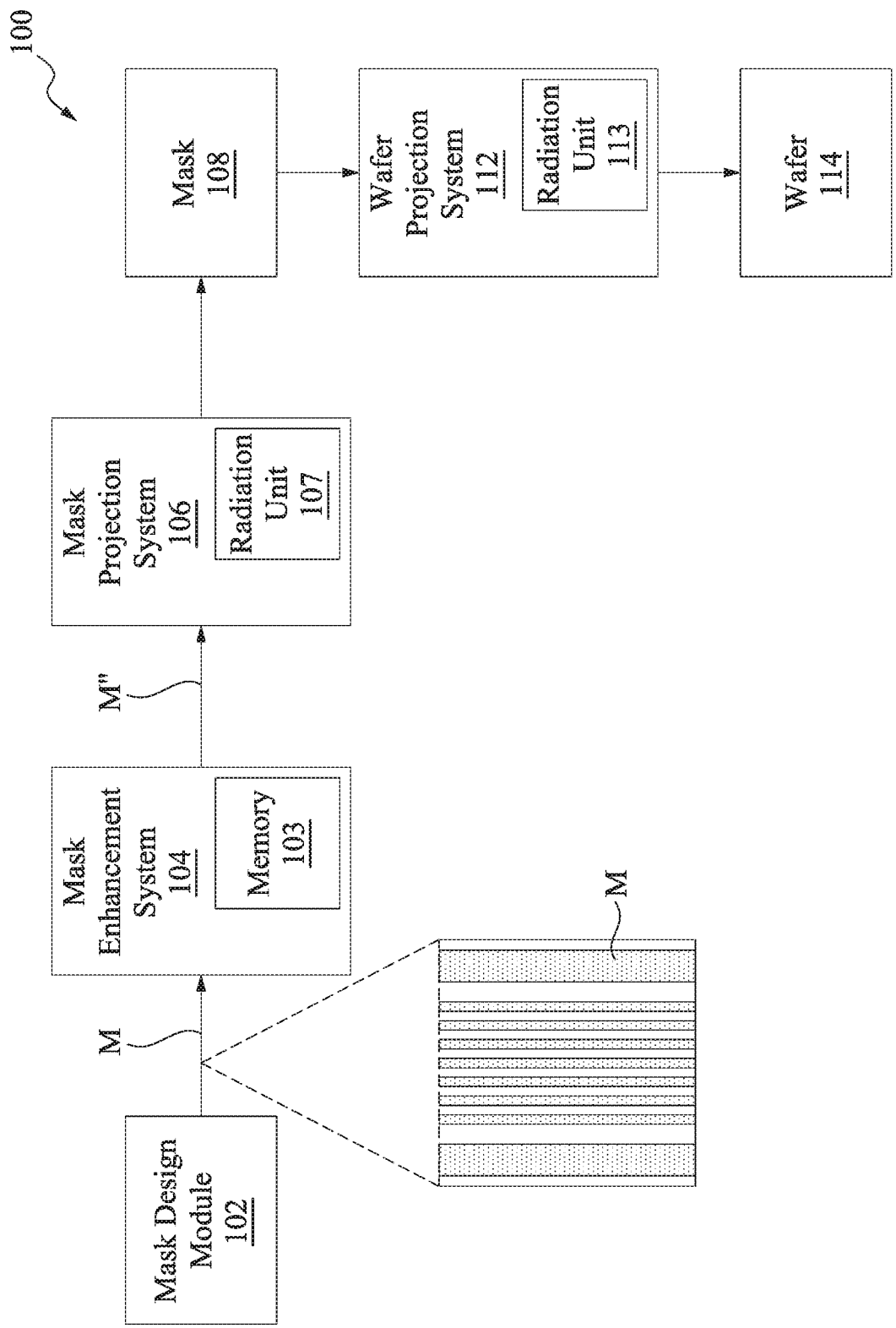
FIG. 1 illustrates a schematic diagram of an integrated circuit fabrication flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In IC design, lithography simulation is used to predict the image of a mask layout, e.g., a photomask layout, created on a wafer, e.g., in a resist layer on the wafer. Such simulations can be used for example to assess the quality of the images, to discover defects, or to perform corrections of the photomask pattern using the OPC. The OPC is used to achieve images, e.g., projections, close to the target layout patterns, to optimize the printing parameters such as the illumination source, or optimize the source and the photomask to achieve better printability. The evaluation of the mask layout design can include identifying areas of the photomask that may produce defects, e.g., pattern bridges where two neighboring separate features become attached or pattern pinches where a connected feature becomes disconnected, on the wafer.

It is more challenging to form a photomask layout for ICs having smaller feature sizes. The proximity of the layout features for smaller feature sizes may cause optical distortion when imaged on the wafer. Image features whose size and/or separation approaches the resolution limit of the radiation source of lithography, are thus subject to distortion. In some embodiments, the proximity effect can be compensated for, at least in part, by modifying any given feature in the opposite direction to the expected distortion.

OPC is one lithography technique used to tune (e.g., correct or enhance) the mask layout for improved imaging effect. The objective of the OPC process is to reproduce on the wafer, the original layout drawn by the IC designer. For example, OPC can be used to compensate for image errors due to optical diffraction or process effects. OPC helps to maintain the edge of the original mask layout in the patterned image on the wafer. If not compensated, after processing, the images patterned on the wafer can appear with irregularities such as line widths that are narrower or wider than designed. OPC can compensate for such irregularities by changing (e.g., correcting) the pattern of the mask layout. In some embodiments, a desired OPC is iteratively identified. In some embodiments, multiple OPCs are iteratively applied, the corrected mask layout is projected on the wafer to produce the IC layout on the wafer, and the corrected mask layout that produces no defects is selected as having the desired OPC.

After the OPC is performed to make the adjustments to the mask layout, the modified layout may still create defects due to the lithographic process. Inspection can be performed to identify areas of the OPCed mask layout that may not be properly printed as an IC layout on the wafer and may produce defective areas on the wafer, e.g., may produce areas on the wafer where pinching and/or bridging occurs.

In some embodiments and after the OPC is performed, an inverse of the lithographic process, e.g., an inverse lithographic technology (ILT) process is applied to the corrected mask layout to remedy the remaining defective areas. In some embodiments, the lithographic process is not linear and ILT process is performed as an iterative process. Thus, the OPC corrected mask layout may be further corrected, e.g., enhanced, by applying the ILT through an iterative process. The iterative process may have a number of iterations and each iteration may have a projection of the corrected and enhanced mask layout on the wafer. In some embodiments, in each iteration both the OPC and the ILT processes are simultaneously applied, the corrected and enhanced mask layout is projected on the wafer to produce the IC layout, and the corrected and enhanced mask layout that produces no defects is selected.

As noted, in each iteration the corrected and enhanced mask layout is projected on the wafer to produce the IC layout. Although a simulation of the projection can be used to predict the image of a mask layout, e.g., the image of a photomask layout, created on a wafer, performing the simulation in each iteration of the iterative process may be very time consuming. In some embodiments, a convolutional neural network is defined and the convolutional neural network is trained offline. The convolutional neural network is trained with a plurality of corrected and enhanced mask layouts as the input and the corresponding IC layout produced by the simulated projection as the output of the convolutional neural network. In some embodiments, after being trained, the convolutional neural network is used for determining the IC layout corresponding to a corrected and enhanced mask layout. Thus, in some embodiments, a first corrected and enhanced mask layout, which is not part of the plurality of corrected and enhanced mask layouts used for training the convolutional neural network, is given as an input to the trained convolutional neural network. An output produced by the convolutional neural network in response to the first corrected and enhanced mask layout is used as the IC layout produced on a wafer corresponding to the first corrected and enhanced mask layout.

FIG. 1 illustrates a schematic diagram of an integrated circuit (IC) fabrication flow 100. The IC fabrication flow 100 begins with a mask design module 102 that provides mask layouts M for producing an IC product. The mask design module 102 creates various mask layouts, e.g., geometrical shapes of target layout patterns, based on the specification of the IC product and for different steps of processing the IC product. In some embodiments, mask layouts M are presented by one or more data files having the information of the geometrical patterns. In some embodiments, the data files are graphic design system (GDS) files. In some embodiments, the mask layouts M are created as a photomask of the geometrical patterns. The IC fabrication flow 100 includes a mask enhancement system 104, which includes a memory 103 in some embodiments. As described in more detail below with respect to FIG. 2, the mask enhancement system 104 performs OPC and ILT enhancement in some embodiments. The OPC is followed by a defect detection of the projected IC layout and then further enhancements are applied to the mask layouts in some embodiments. The mask enhancement system 104 creates a corrected and enhanced mask layout M", e.g., an OPC-ILT-enhanced mask layout M". In some embodiments, the OPC-ILT-enhanced mask layout M" is presented by one or more GDS files having the information of the corrected and enhanced geometrical patterns. In some embodiments, the OPC-ILT-enhanced mask layout M" are created as a photomask with the corrected and enhanced geometrical patterns on a blank mask, e.g., on a mask-blank to create a mask 108.

In some embodiments, the IC fabrication flow 100 further includes a mask projection system 106 includes a radiation unit 107. In some embodiments, the mask projection system 106 produces the corrected and enhanced photomask layouts M" from the data files and then optically projects, e.g., by an extreme ultraviolet (EUV) light beam of the radiation unit 107, the corrected and enhanced photomask layouts M" to the mask-blank to produce the mask 108. In some embodiments, the mask projection system 106 may use the data files of the corrected and enhanced mask layout M" and projects, e.g., by an electron beam of the radiation unit 107, the corrected and enhanced mask layout M" to a mask-blank coated with a photo resist to produce the mask 108.

In some embodiments, the IC fabrication flow 100 includes a wafer projection system 112 that includes a radiation unit 113. In some embodiments, the wafer projection system 112 produces an IC layout from the corrected and enhanced photomask layouts M" of the mask 108. The wafer projection system 112 may implement an optical projection using an EUV light beam of the radiation unit 113 to produce the IC layout on a wafer 114. In some embodiments, the wafer projection system 112 implements an electron beam projection using an electron beam of the radiation unit 113 to produce the IC layout on the wafer 114.

Figure 2A:
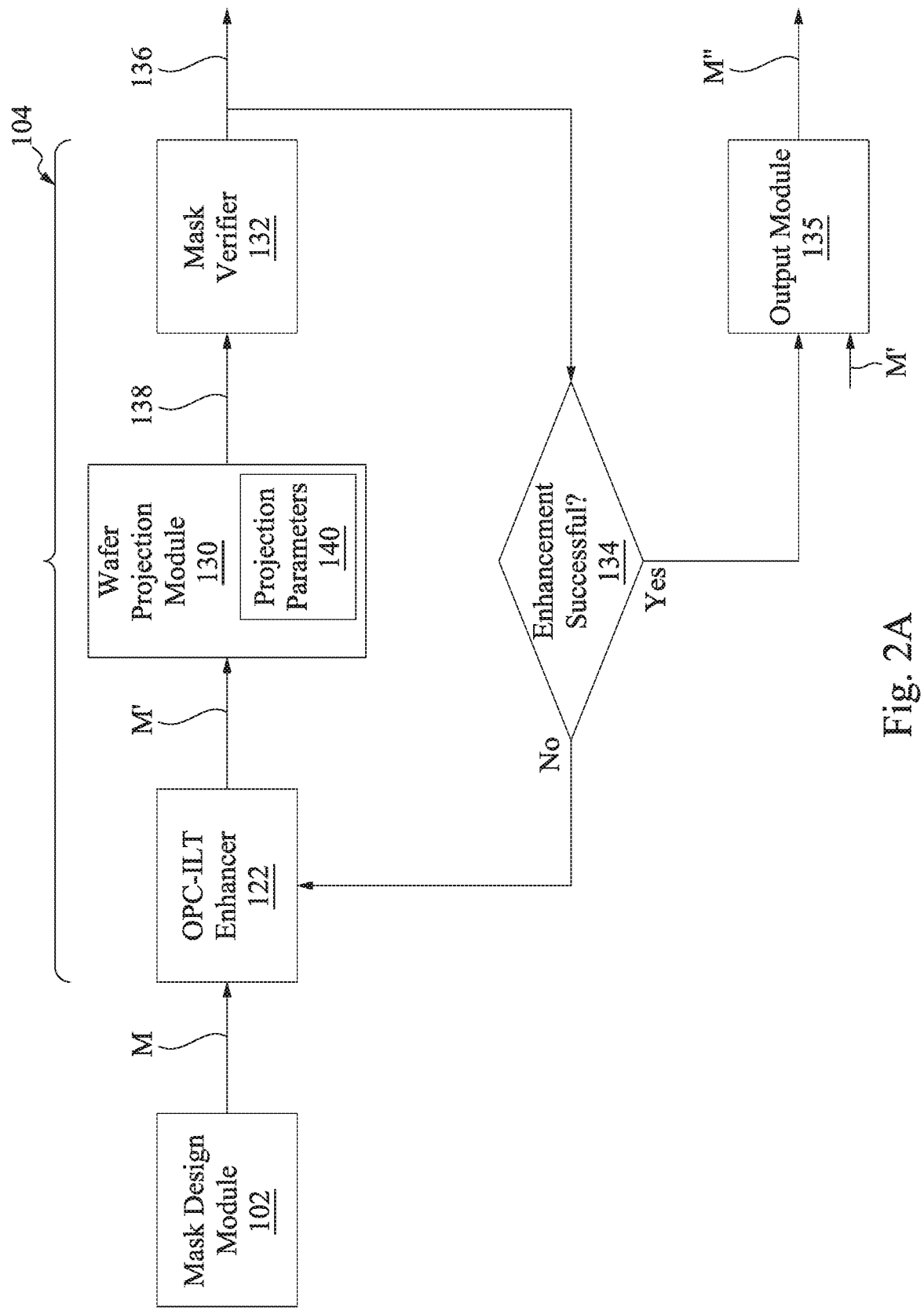
FIG. 2A illustrates an schematic process for enhancing a lithographic mask.

FIG. 2A illustrates a schematic process for enhancing a lithographic mask. As shown, the mask enhancement system 104 includes an OPC-ILT enhancer 122 that receives the mask layout M produced by the mask design module 102 and produces an OPC-ILT-enhanced mask layout M'. As described, OPC is a lithography technique that is used to correct the mask layout M, and produce improved imaging effects to reproduce, on the wafer 114, the original layout drawn by the mask design module 102. For example, OPC can be used to compensate for imaging distortions due to optical diffraction. In some embodiments, the mask layout M is a data file, e.g., a GDS file, having the information of the geometrical patterns to be produced on the wafer 114, and the OPC-ILT enhancer 122 modifies the data file and produces a corrected data file, e.g., a corrected or adjusted GDS file, representing a corrected and enhanced mask layout M'.

FIG. 2A further includes a wafer projection module 130 that performs a projection of the corrected and enhanced mask layout M' to produce a projected IC layout 138 on the wafer 114. In some embodiments, the corrected and enhanced mask layout M' is a data file, e.g., a GDS file, and the wafer projection module 130 simulates the projection of the corrected and enhanced mask layout M' on the wafer 114 and produces the IC layout 138 by simulation. Although, the corrected and enhanced mask layout M' is corrected by OPC and enhanced by ILT, defective areas may be produced when the corrected and enhanced mask layout M' is projected as the IC layout 138 on the wafer 114. The mask verifier 132 of the mask enhancement system 104 inspects the IC layout 138 to find the defects of the IC layout 138. In some embodiments, the mask verifier 132 generates a defect list 136 of the defects of the IC layout 138. In some embodiments, the defect list 136 is tested at step 134 and if the defect list 136 is not empty, e.g., a defect exists in the defect list 136, the iterations continue by modifying the OPC and ILT enhancement at the OPC-ILT enhancer 122. In some embodiments, if the defect list 136 is empty, an output module 135 provides the corrected and enhanced mask layout of the current iteration as enhanced photomask layouts M" at the output of the mask enhancement system 104. In some embodiments, the OPC-ILT enhancer 122 commands the wafer projection module 130 to set the projection parameters 140 for projecting, e.g., the simulated projection, of the corrected and enhanced mask layout M' on the wafer 114. In some embodiments, the projection parameters 140 include a radiation energy level and projection parameters of the wafer projection module 130 that is used for the projection. In some embodiments, the projection parameters 140 include a light radiation energy level and imaging parameters of an imaging system that is used for the projection. The imaging parameters and radiation energy level may provide a depth of focus of the imaging system. In some embodiments, a defect in the IC layout 138 is identified when a probability of the defect occurring in the IC layout 138 is above a threshold.

Figure 2B:
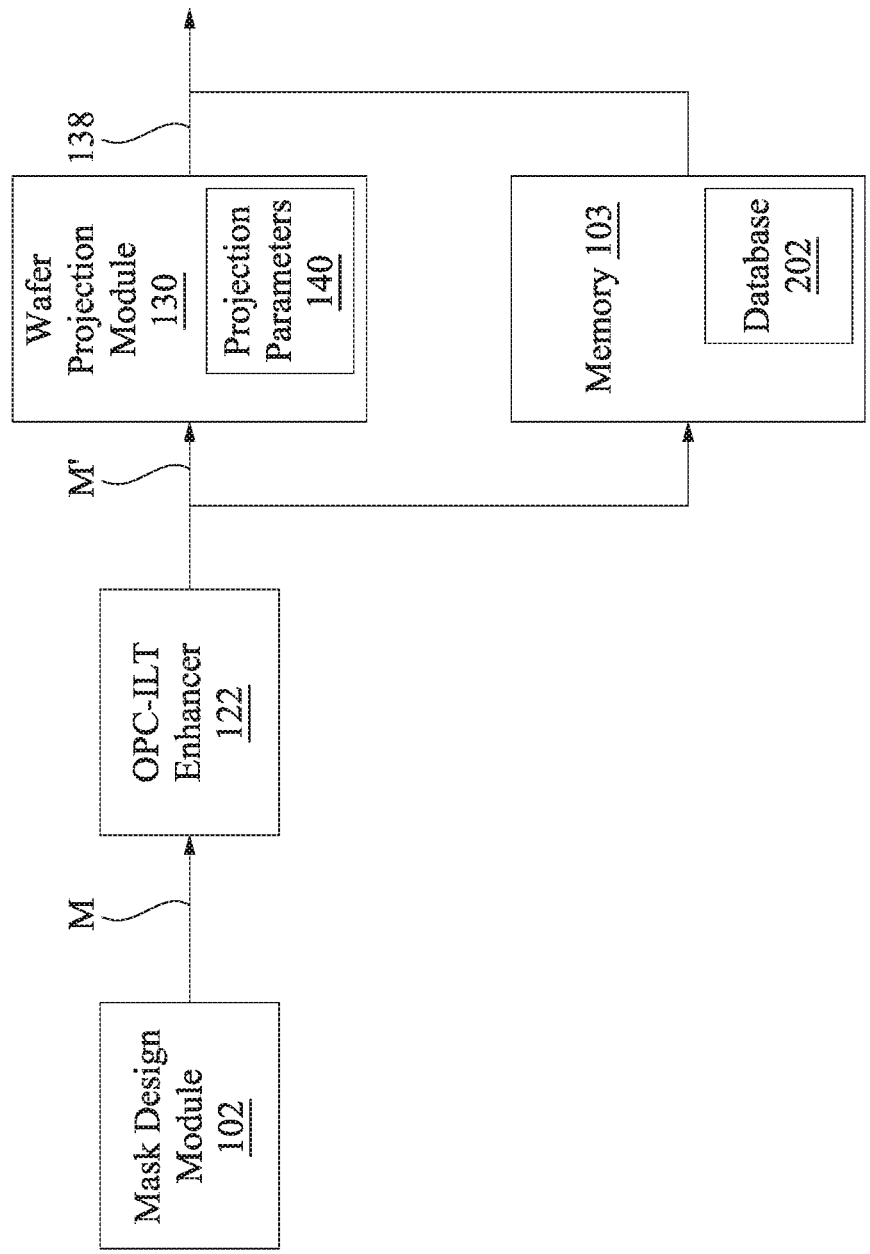
FIG. 2B illustrates an exemplary system for generating a database of enhanced lithographic masks in accordance with some embodiments of the disclosure.

FIG. 2B illustrates an exemplary system for generating a database of enhanced lithographic masks in accordance with some embodiments of the disclosure. FIG. 2B illustrates the mask design module 102, the OPC-ILT enhancer 122, and the wafer projection module 130 of FIG. 2A. In some embodiments, the mask design module 102 generates a plurality of mask layouts M and the OPC-ILT enhancer 122 performs the corrections and enhancements on the mask layouts M to produce a plurality of OPC-ILT-enhanced mask layouts M'. The plurality of OPC-ILT-enhanced mask layouts M' are projected by the wafer projection module 130 to a wafer to produce the IC layouts 138. FIG. 2B further includes a database 202 for arranging the OPC-ILT-enhanced mask layouts M' and the corresponding IC layout 138. The database 202 may be stored in the memory 103 of the mask enhancement system 104. In some embodiments, the database 202 is used by a training system 600 of FIG. 6, as described below. In addition to the OPC-ILT-enhanced mask layouts M' and the corresponding IC layout 138, each record of the database 202 may include the projection parameters 140 that are used for generating the IC layout 138 from each one of the OPC-ILT-enhanced mask layouts M'. In some embodiments, the wafer projection module generates different IC layouts 138 for each OPC-ILT-enhanced mask layouts M' such that each IC layout 138 is produced with different projection parameters 140. Thus, the database 202 may include multiple records for each of the OPC-ILT-enhanced mask layouts M'.

FIG. 3 illustrates an exemplary process for enhancing a lithographic mask in accordance with some embodiments of the disclosure. As shown, FIG. 3 shows the mask enhancement system 104 that includes the OPC-ILT enhancer 122 that receives the mask layout M, generated by the mask design module 102 of FIG. 1, and produces an OPC-ILT-enhanced mask layout M'. The mask enhancement system 104 of FIG. 3 also includes a convolutional neural network 302. In some embodiments, the convolutional neural network 302 (described with respect to FIGS. 4A, 4B, 4C, 4D, 4E, and 5) is trained to receive the corrected and enhanced mask layout M' and to determine, e.g., generate, the IC layout 138, which is the projection of the corrected and enhanced mask layout M' on the wafer 114. As described, the mask verifier 132 of the mask enhancement system 104 inspects the IC layout 138 to find the defects of the IC layout 138 and generates the defect list 136 of the defects of the IC layout 138. In some embodiments, the defect list 136 is tested at step 134 and if the defect list 136 is not empty, the iterations continue by modifying the OPC and ILT enhancement at the OPC-ILT enhancer 122. In some embodiments, if the defect list 136 is empty, the output module 135 provides the corrected and enhanced mask layout of the current iteration as enhanced photomask layouts M" at the output of the mask enhancement system 104. In some embodiments, the training of the convolutional neural network 302 includes a radiation energy level and projection parameters for producing the IC layout 138 from the corrected and enhanced mask layout M'. Thus, the output provided by the convolutional neural network 302, in addition to the IC layout 138, includes the radiation energy level and projection parameters for producing the IC layout 138 on the wafer 114. In some embodiments, a defect is identified when a critical dimension (CD) uniformity or a uniformity of the space between the geometrical shapes of the IC layout 138 is below a desired threshold. In some embodiments, a defect is detected when the following are identified: an edge placement error above a threshold, an image log-slope above a threshold, or an error placement factor above a threshold.

In some embodiments, the IC layout 138 provided by the convolutional neural network 302 is verified by the mask verifier 132 as having the radiation energy level and/or focus parameters within a process window. In some embodiments, the focus parameters are determined based on the radiation energy level and the projection parameters. In some embodiments, the process window includes an energy threshold level or range for the radiation unit 113 of the wafer projection system 112 of FIG. 1 to generate the IC layouts 138 on the wafer 114. In some embodiments, the process window includes the depth of focus threshold level or the depth of focus range for the IC layouts 138 on the wafer 114 such that due to roughness and/or flatness of the surface of the wafer 114, the IC layout 138 with the depth of focus within the focus threshold range is produced on the wafer 114. Thus, in addition to the defects, the defect list 136 may present the other deficiencies as a defect. The other deficiencies include out of the energy threshold range and/or out of the focus threshold range. In some embodiments, the convolutional neural network 302 provides multiple IC layouts 138 having different radiation energy levels and/or focus parameters. One of the IC layouts 138 may be selected at step 134 based on a criterion that may include having the radiation energy level and/or focus parameters within the process window and having no defects. In some embodiments, no IC layout 138 is selected at step 134 and the iterations continue with additional corrections and enhancements by the OPC-ILT enhancer 122.

Figure 4A:
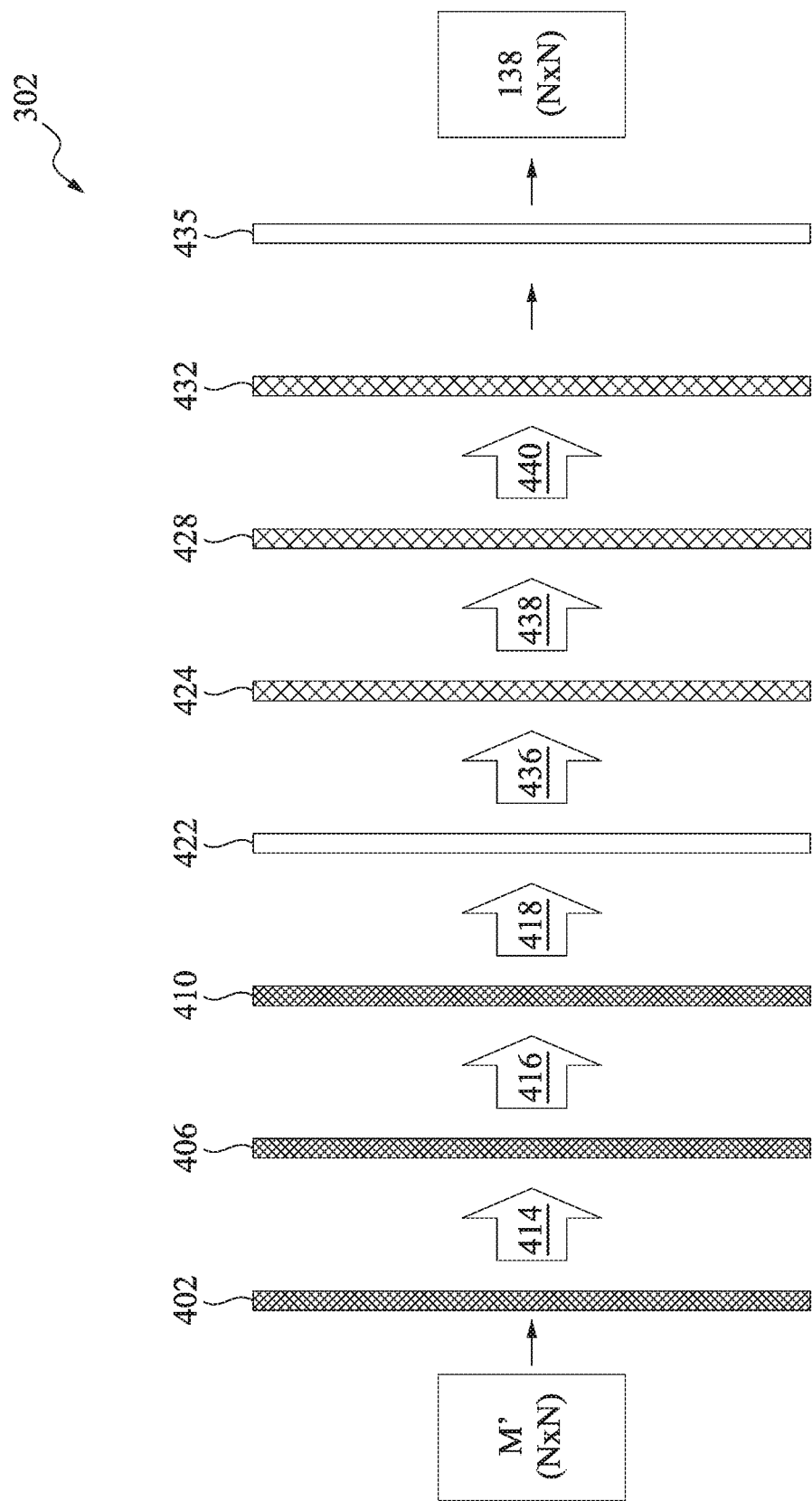
FIG. 4A illustrates an exemplary convolutional neural network in accordance with some embodiments of the disclosure.

FIG. 4A illustrates an exemplary convolutional neural network in accordance with some embodiments of the disclosure. The convolutional neural network 302 of FIG. 3 is shown in FIG. 4A. The convolutional neural network 302 receives the OPC-ILT-enhanced mask layouts M' as an input and provides the IC layout 138 as an output. In some embodiments, both input and output of the convolutional neural network 302 are N by N matrices where N is 512, 256, 128, or 64. In some embodiments, the input is shown as a layer 402. The convolutional neural network 302 includes down-sampling processes 414, 416, and 418 and also include up-sampling processes 436, 438, and 440. A down-sampling process is described with respect to FIGS. 4B and 4C and an up-sampling process is described with respect to FIGS. 4D and 4E.

In some embodiments, the down-sampling processes 414, 416, and 418 extract features of a previous stage, e.g., the layer 402, and produce a smaller size image in a subsequent layer 406. In some embodiments, the layer 402 is N by N, the layer 406 is N/2 by N/2, a layer 410 is N/4 by N/4 and a layer 422 is N/8 by N/8 such that in each of the down-sampling processes 414, 416, and 418 the size of the layer is halved. In some embodiments, the up-sampling processes 436, 438, and 440 combine the down sampled layers and reconstruct an up-sampled, e.g., a transposed convolution layer such that a layer 424 is N/4 by N/4, a layer 428 is N/2 by N/2, and layers 432 and 435 are N by N where the layer 435, which is a fully connected layer such that each element of the layer 435 is connected by a weight to all elements of a previous layer 432. In some embodiments and as shown below in FIG. 5, the up-sampling is used for doubling the size of the layer in one dimension and the concatenation of the activation layers of the down-sampling processes doubles the size in the other dimension.

Figure 4B:
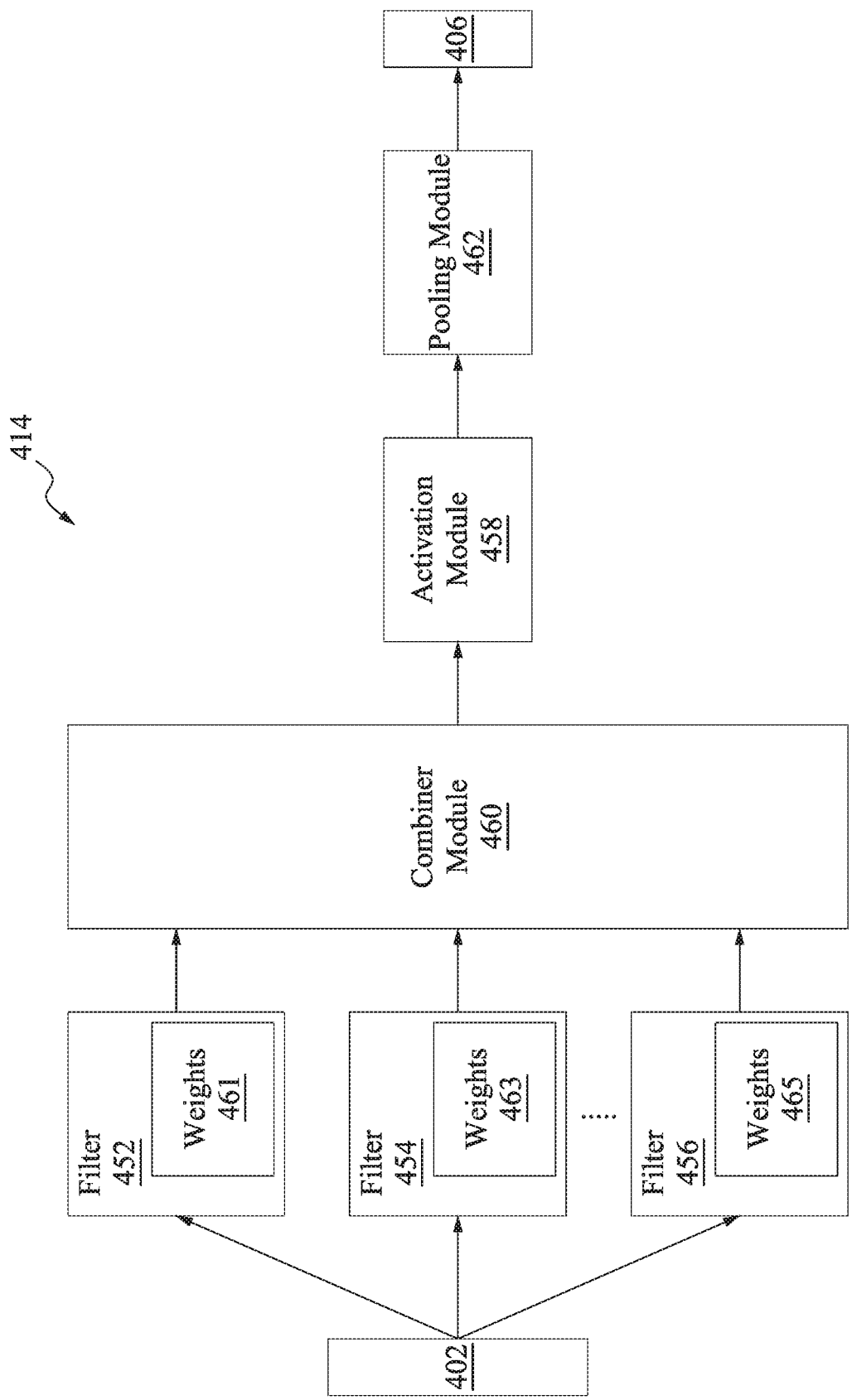
FIGS. 4B and 4C respectively illustrate an exemplary down-sampling process and an exemplary down-sampling filter of the convolutional neural network in accordance with some embodiments of the disclosure.
Figure 4E:
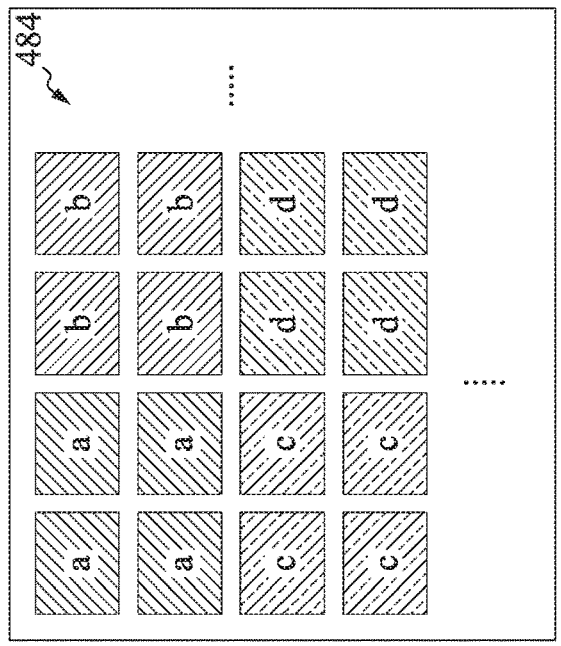
FIGS. 4D and 4E respectively illustrate an exemplary up-sampling process and an exemplary up-sampled pattern of a convolutional neural network in accordance with some embodiments of the disclosure.
Figure 4D:
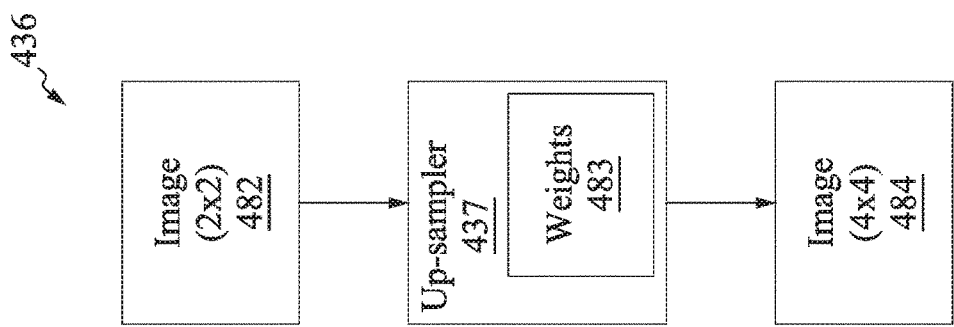
Figure 4C:
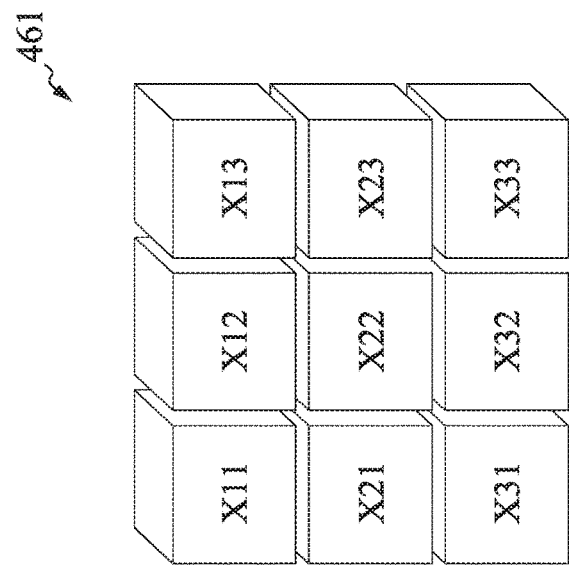

FIGS. 4B and 4C respectively illustrate an exemplary down-sampling process and an exemplary down-sampling filter of the convolutional neural network in accordance with some embodiments of the disclosure. The down-sampling process 414 of FIG. 4B starts from the layer 402, which is consistent with the OPC-ILT-enhanced mask layouts M'. An image of the layer 402 passes through a plurality of filters 452, 454, and 456 and outputs of the filters 452, 454, and 456 are combined, e.g., concatenated, by a combiner module 460 to produce a combined filtered image. FIG. 4C shows a point spread function (PSF) of the filter 452 as a 3 by 3 matrix of weights 461. In some embodiments, the PSF of the filter 452 is convolved with the layer 402 to provide the output of the filter 452. In some embodiments, the 9 elements of the PSF of the filter 452, e.g., weights 461, are unknown and are parameters of the convolutional neural network 302 that are set during a training phase of the convolutional neural network 302. The training of the convolutional neural network 302 is described with respect to FIG. 6. Similarly, all or part of the elements of the PSF of the filters 454 and 456, e.g., weights 463 and 465, are unknown and are set during the training phase of the convolutional neural network 302. In some embodiments, a size of the PSF of the filters 452, 454, and 456 is the same. In some embodiments, the PSF of the filters 452, 454, and 456 have different sizes, e.g., M by P where M and P are between 2 to 5. In some embodiments, one or more of the filters 452, 454, and 456 perform edge detection or determine a bias of an image and, thus, a portion of the weights 461, 463, 465 are preset to perform the specific task. And a remaining portion of the weights are determined during the training phase of the convolutional neural network 302.

In some embodiments, the combined filtered image coming from the combiner module 460 passes through an activation module 458 such that the activation module 458 replaces negative values and produces a non-negative image, e.g., an activation image, that is sent to a pooling module 462 to produce the layer 406. In some embodiments, the filtered images have the same size of the input image, e.g. layer 402, however, the pooling module 462 reduces the size of the image. In some embodiments, the pooling module 462 slides a 2 by 2 matrix on the input image from the activation module 458 and for each 2 by 2 matrix a maximum of the 2 by 2 points are selected as a single point of the output of the pooling module 462. In some embodiments, when the input image to the pooling module 462 is N by N the output image of the pooling module 462 is N/2 by N/2. In some embodiments, the combiner module 460 concatenates multiple filtered images of the size N by N and thus the image after the pooling module is a concatenation of multiple N/2 by N/2 images. The down-sampling processes 416 and 418 are consistent with the down-sampling process 414 and similarly, all or part of the elements of the PSF of the filters of the down-sampling processes 416 and 418 are unknown and are set during the training phase of the convolutional neural network 302. In some embodiments, a portion of the elements of the PSF of the filters of the down-sampling processes 416 and 418 that are not set during the training phase of the convolutional neural network 302 are preset.

FIGS. 4D and 4E respectively illustrate an exemplary up-sampling process and an exemplary up-sampled pattern of a convolutional neural network in accordance with some embodiments of the disclosure. As shown in FIG. 4D, the up-sampling process 436 includes an up-sampler module 437 that includes weights 483. The up-sampler module 437 expands a 2 by 2 image into a 4 by 4 image as shown in FIG. 4E. In some embodiments, the 2 by 2 image includes four elements a, b, c, and d and after the up-sampling the 4 by 4 image is shown as a 4 by 4 matrix 484. In some embodiments, the weights 483 includes a separate weight for each element of the 4 by 4 matrix such that the matrix 484 is applied by the weights 483. In some embodiments, the weights 483 are set during the training phase of the convolutional neural network 302. The up-sampling processes 438 and 440 are consistent with the up-sampling process 436 and similarly, all or part of the weights of the up-sampler modules of the up-sampling processes 438 and 440, which are consistent with the up-sampler module 437 of the up-sampling process 436 are set during the training phase of the convolutional neural network 302. In some embodiments, a portion of the weights of the up-sampler modules that are not set during the training phase of the convolutional neural network 302 are preset.

Figure 5:
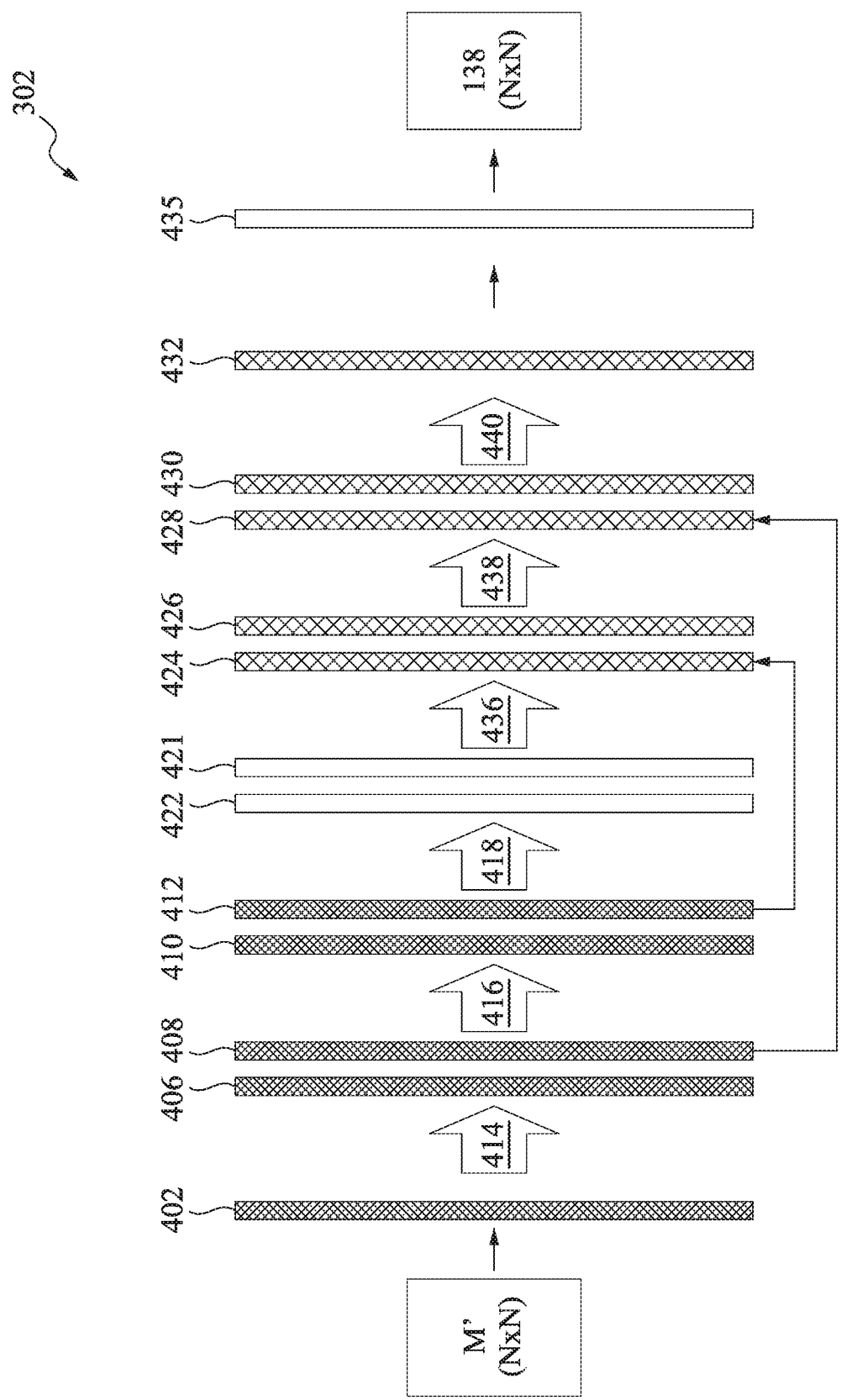
FIG. 5 illustrates an exemplary convolutional neural network in accordance with some embodiments of the disclosure.

FIG. 5 illustrates an exemplary convolutional neural network in accordance with some embodiments of the disclosure. FIG. 5 is consistent with FIG. 4A and additionally shows an extra layer in each stage of down-sampling. In some embodiments, the down-sampling processes 414, 416 and 418 provide the layers 406, 410, and 422 that are shown in FIG. 4A. FIG. 5 additionally shows activation layers 408, 412 and 421 that may be produced by implementing the activation module 458 of FIG. 4B on the layers 406, 410, and 422 respectively. In some embodiments, the down-sampling process 414 uses the input image, e.g. layer 402, to provide the layer 406 and the activation module 458 of the down-sampling process 414 produces the activation layer 408. Similarly, the down-sampling processes 416 and 418 use previous layers, e.g., previous activation layers, as input layers to produce the next layers 410 and 422. In addition, the down-sampling processes 416 and 418 use activation module 458 on the layers 410 and 422 to produce the activation layers 412 and 421. Similar to FIG. 4A, the size of image is reduced by half in each stage of down-sampling. Also, at least a portion of the weights of the PSF of the filters of the down-sampling processes 414, 416 and 418 are set during the training phase of the convolutional neural network 302. The up-sampling processes 436, 438, and 440 have an additional step such that the activation layer of a previous comparable stage of down-sampling having the same size are concatenated to the up-sampled layers. In some embodiments, the activation layer 412 is concatenated to the up-sampled layer 421 to produce a layer 426 and the activation layer 408 is concatenated to the up-sampled layer 426 to produce a layer 430. In some embodiments, additional weights are used when concatenating the activation layers to the up-sampled layers such that a same weight for every pixel, or alternatively, a per pixel weight may be used for concatenating the activation layers. The additional weights of the up-sampling processes 436, 438, and 440 may also be set during the training phase of the convolutional neural network 302.

Figure 6:
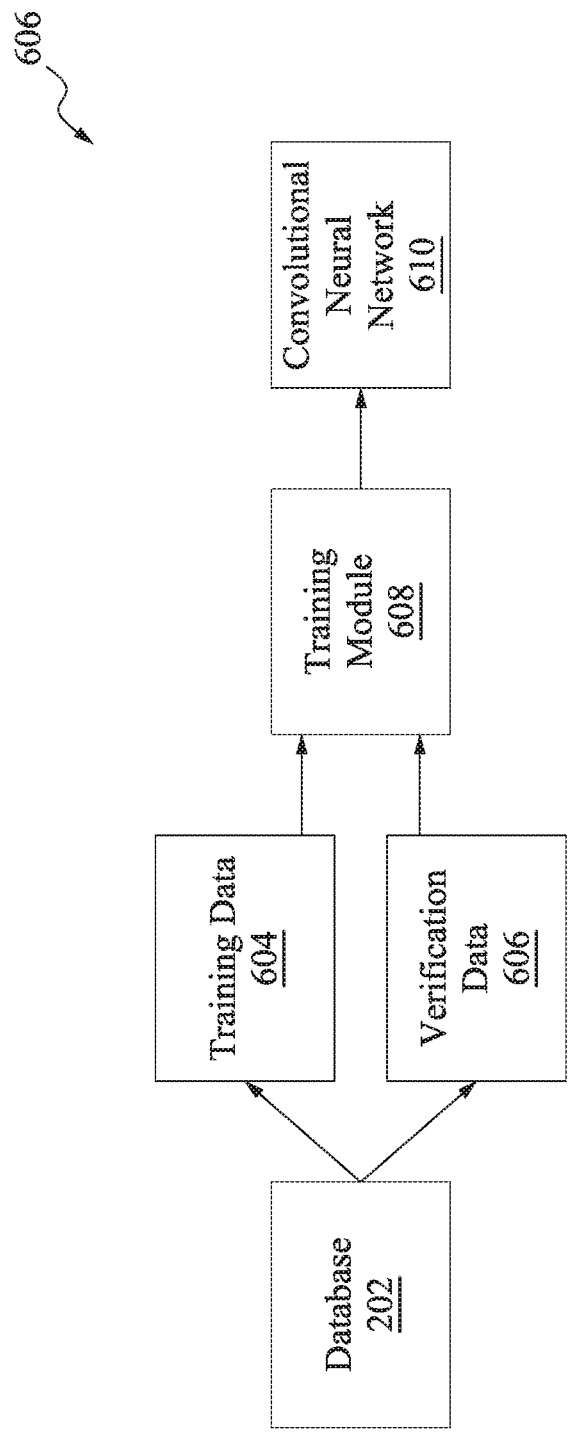
FIG. 6 illustrates an exemplary training system for training a convolutional neural network in accordance with some embodiments of the disclosure.

FIG. 6 illustrates an exemplary training system 600 for training a convolutional neural network in accordance with some embodiments of the disclosure. FIG. 6 illustrates the database 202 of FIG. 2B where each record of the database 202 may include the OPC-ILT-enhanced mask layouts M' and the corresponding IC layout 138. In addition to the OPC-ILT-enhanced mask layouts M' and the corresponding IC layout 138, each record of the database 202 may include the projection parameters 140 that are used for generating the IC layout 138 from the OPC-ILT-enhanced mask layouts M'. In some embodiments, the records of the database 202 are divided into a training data set 604 and a verification data set 606. In some embodiments, a training module 608 of the training system 600 uses the training data set 604 to train the convolutional neural network 610. The convolutional neural network 610 is consistent with the convolutional neural network 302 of FIG. 3. As noted, an OPC-ILT-enhanced mask layout M' in each record of the database 202 is an input of the convolutional neural network 610 and a corresponding IC layout 138 in the same record of the database 202 is the output of the convolutional neural network 610. In some embodiments, the training of the convolutional neural network 610 includes setting the parameters of the convolutional neural network 610 such that each OPC-ILT-enhanced mask layout M' of a record of the database 202 produces the corresponding IC layout 138 of the same record of the database 202. Parameters of the convolutional neural network 610 are described above with respect to FIGS. 4B and 4D. In some embodiments, the parameters of the convolutional neural network 610 are determined in an iterative procedure. Initially, the parameters are set to initial values, e.g., random values, the outputs of the convolutional neural network 610 to each OPC-ILT-enhanced mask layout M' as the inputs are determined, and an error, e.g., sum of the squared differences between the corresponding IC layout 138 of the database 202 and the outputs of the convolutional neural network 610 are determined. Then, the parameters of the convolutional neural network 610 are iteratively modified until the error is minimized, e.g., the error becomes less than a threshold.

In some embodiments, after the training module 608 trains the convolutional neural network 610 with the training data set 604, the training module 608 verifies the training with a verification data set 606. In some embodiments, the verification data set 606 is separate from the training data set 604 and the training is verified when for each record of the training data set 604 an error, e.g., a squared error, between the IC layout 138 of a record of the database 202 and the output of the convolutional neural network 610 to the corresponding OPC-ILT-enhanced mask layout M' of the same record is below a threshold level. In some embodiments, if the training is verified, the training data set 604 is increased and the convolutional neural network 610 is retrained.

Figure 7:
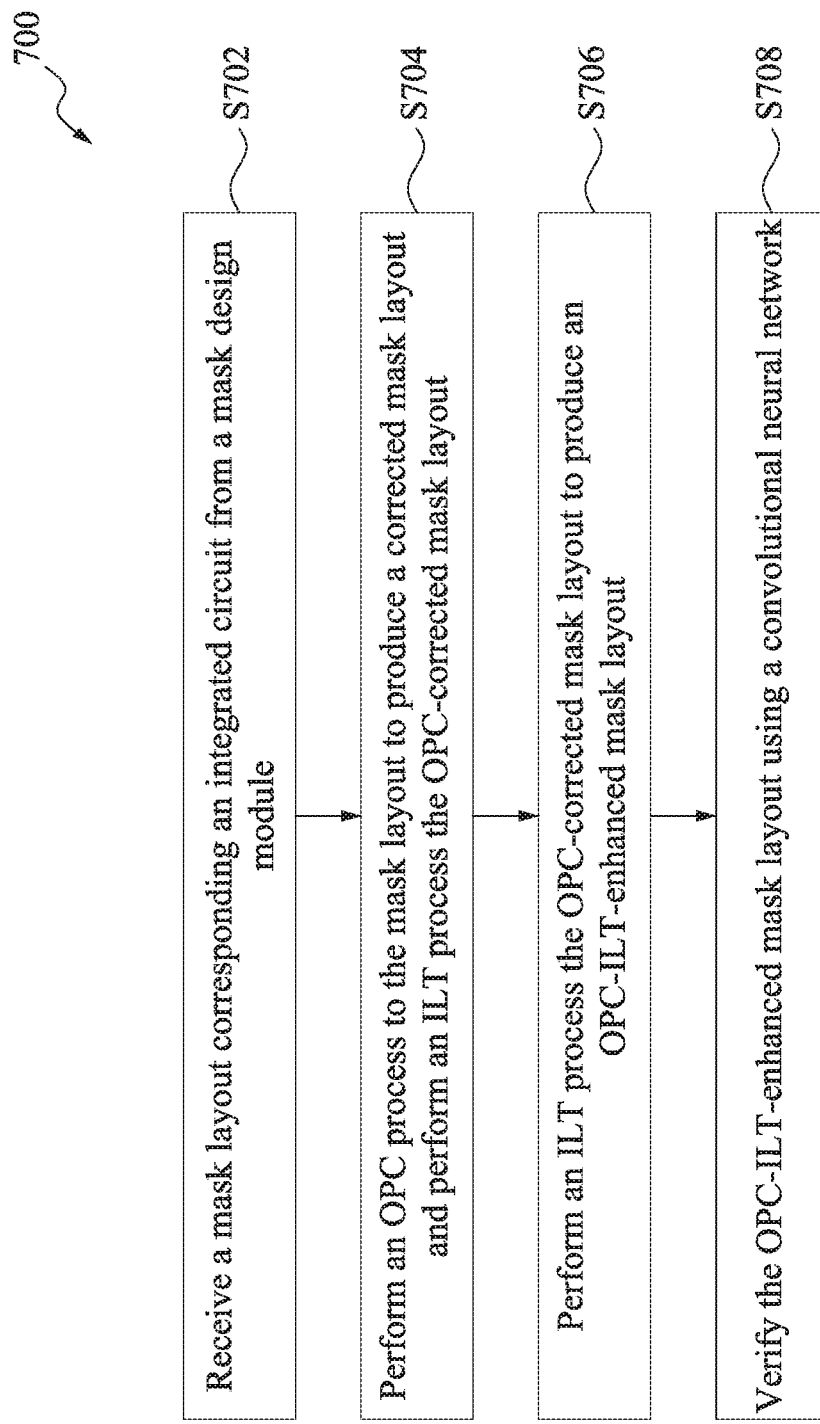
FIG. 7 illustrates a flow diagram of an exemplary process for manufacturing a lithographic mask in accordance with some embodiments of the disclosure.

FIG. 7 illustrates a flow diagram of an exemplary process 700 for manufacturing a lithographic mask in accordance with some embodiments of the disclosure. The method includes an operation S702 of receiving a mask layout corresponding to an integrated circuit from a mask design module. In some embodiments, the mask layout M is generated by the mask design module 102 of FIG. 1 and the mask layout M is received by the OPC-ILT enhancer 122 of FIG. 3. In operation S704, an OPC process is performed on the mask layout M and a corrected mask layout is produced. In operation S706, after the OPC process, an ILT process is performed on the corrected mask layout. In some embodiments, the OPC process and the ILT process are performed by the OPC-ILT enhancer 122 of FIG. 2 or 3 and an OPC-ILT-enhanced mask layout M' is produced. In operation S708, the OPC-ILT-enhanced mask layout M' is verified using a convolutional neural network. As described, in some embodiments, the convolutional neural network, e.g. the convolutional neural network 610 of FIG. 6 is trained with a plurality of OPC-ILT-enhanced mask layouts as the inputs and corresponding IC layouts that are produced on a wafer as outputs. In some embodiments, when the OPC-ILT-enhanced mask layout M' is fed to the convolutional neural network 302 of FIG. 3, an IC layout 138 is generated by the convolutional neural network 302. In some embodiments, the IC layout 138 is used by the mask verifier 132 of FIG. 3. In some embodiments as shown in FIG. 3, the mask verifier 132 generates the defect list 136 indicating if the enhancements performed by the OPC-ILT enhancer 122 are verified. The defect list 136 indicates if the enhancements performed by the OPC-ILT enhancer 122 on the mask layout M that produced the OPC-ILT-enhanced mask layout M' that in turn produced the IC layout 138 on the wafer is verified.

In some embodiments, the IC layout 138 is verified when the IC layout 138 does not generate a defect. In some embodiments, the IC layout 138 generated by the convolutional neural network 302 generates one or more parameters, e.g., a radiation energy for generating the IC layout 138 and/or a depth of focus of the generated IC layout 138. In some embodiments, the IC layout 138 is verified for having the one or more parameters within a process window. In some embodiments, the process window includes a threshold range of radiation energy for generating the IC layouts on the wafer and a depth of focus threshold range for the generated IC layout.

FIGS. 8A and 8B illustrate an apparatus for manufacturing a lithographic mask for a semiconductor circuit in accordance with some embodiments of the disclosure. FIG. 8A is a schematic view of a computer system that executes the process for manufacturing the lithographic mask according to one or more embodiments as described above. All of or a part of the processes, method and/or operations of the foregoing embodiments can be realized using computer hardware and computer programs executed thereon. The operations include OPC correction, ILT enhancement, mask projection, defect detection, and convolutional neural network training and operation in some embodiments. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. The computer 801 is provided with, in addition to the optical disk drive 805 and the magnetic disk drive 806, one or more processors 811, such as a micro processing unit (MPU), a ROM 812 in which a program, such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program for causing the computer system 800 to execute the process for manufacturing the lithographic mask of a semiconductor device in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the process for manufacturing the lithographic mask of a semiconductor device in the foregoing embodiments. The program may only include a command portion to call an appropriate function (module) in a controlled mode and obtain desired results.

As discussed above, by training the convolutional neural network offline and using the convolutional neural network for determining the projection of the mask layout as the IC layout on the wafer, eliminates a time consuming simulation of projecting the mask layout on the wafer. Also, the convolutional neural network provides multiple IC layouts on the wafer such that at least one of the IC layouts does not produce defects, and thus performing extra iterations is prevented. As described herein, in some embodiments, correcting a mask layout using ILT is performed after the OPC is performed. In some embodiments, the mask layout is not a photomask layout and, thus, OPC is not performed but ILT is performed. In some embodiments, distributed processing may be used to train the convolutional neural network to reduce a turn-around time of the training.

It will be understood that not all advantages have been necessarily discussed herein, no particular advantage is required for all embodiments or examples, and other embodiments or examples may offer different advantages.

According to some embodiments of the present disclosure, a method for manufacturing a lithographic mask for an integrated circuit includes performing an optical proximity correction (OPC) process to an integrated circuit mask layout to produce a corrected mask layout. The method also includes performing an inverse lithographic technology (ILT) process to the corrected mask layout to enhance the corrected mask layout to produce an OPC-ILT-enhanced mask layout. The method further includes verifying the OPC-ILT-enhanced mask layout using a convolutional neural network. In an embodiment, the verifying the OPC-ILT-enhanced mask layout includes using the convolutional neural network to generate a first IC layout as an IC layout when the OPC-ILT-enhanced mask layout is projected on a wafer, and inspecting the first IC layout to verify that the first IC layout does not generate defects. In an embodiment, the generated first IC layout includes one or more parameters of the first IC layout and the verifying the OPC-ILT-enhanced mask layout further includes verifying the one or more parameters are within a process window. The process window includes a threshold range of radiation energy for generating the first IC layout and a depth of focus threshold range for the generated first IC layout. In an embodiment, the verifying the first IC layout does not generate defects when verifying a probability of generating a defect in the first IC layout is below a first threshold level. In an embodiment, the integrated circuit mask layout includes a graphic design system (GDS) file, and the OPC-ILT-enhanced mask layout includes an adjusted GDS file. In an embodiment, prior to the verifying the OPC-ILT-enhanced mask layout a database is generated. The database generation includes generating a plurality of integrated circuit mask layouts, performing one or more OPC-ILT enhancements on each one of the plurality of integrated circuit mask layouts to produce OPC-ILT-enhanced mask layouts, performing mask projection of each one of the OPC-ILT-enhanced mask layouts to generate a corresponding IC layout, and storing the OPC-ILT-enhanced mask layouts and the corresponding IC layouts in the database stored in a storage memory. The method further includes training the convolutional neural network based on a first portion of the database. The OPC-ILT-enhanced mask layouts are inputs of the convolutional neural network and the corresponding IC layouts are outputs of the convolutional neural network and verifying the convolutional neural network based on a remaining second portion of the database. In an embodiment, the performing the mask projection is a simulation projection. In an embodiment, the method further includes performing two or more mask projections for each one of the OPC-ILT-enhanced mask layouts to generate two or more corresponding IC layouts for each one of the OPC-ILT-enhanced mask layouts. The two or more mask projections have different exposure doses and different depth of focus conditions. In an embodiment, the first IC layout includes a corresponding exposure dose and a corresponding depth of focus for generating the first IC layout. The method further includes verifying the corresponding exposure dose and the corresponding depth of focus are within the process window. In an embodiment, the method further includes performing another OPC process and or another ILT process to the integrated circuit mask layout to produce another OPC-ILT-enhanced mask layout and verifying the another OPC-ILT-enhanced mask layout using the convolutional neural network.

According to some embodiments of the present disclosure, a method for manufacturing a lithographic mask for an integrated circuit includes performing an optical proximity correction (OPC) process to a mask layout corresponding the integrated circuit to produce a corrected mask layout. The method also includes performing an inverse lithographic technology (ILT) process to the corrected mask layout to enhance the corrected mask layout to produce an OPC-ILT-enhanced mask layout. The method further includes verifying the OPC-ILT-enhanced mask layout using a convolutional neural network. If the OPC-ILT-enhanced mask layout is not verified, the performing the OPC process and the ILT process continue until the OPC-ILT-enhanced mask layout is verified. In an embodiment, the method further includes receiving the mask layout from a mask design module. The mask layout is a photomask layout. In an embodiment, the verifying the OPC-ILT-enhanced mask layout includes using the convolutional neural network to generate a first IC layout as an IC layout when the OPC-ILT-enhanced mask layout is projected on a wafer and inspecting the first IC layout to verify that the first IC layout does not generate defects. In an embodiment, the first IC layout includes one or more parameters of the first IC layout and the verifying the OPC-ILT-enhanced mask layout further includes verifying the one or more parameters are within a process window, wherein the process window comprises a threshold range of radiation energy for generating the first IC layout and a depth of focus threshold range for the first IC layout.

According to some embodiments of the present disclosure, a system for manufacturing a lithographic mask for an integrated circuit includes an OPC-ILT enhancer module that receives a first mask layout corresponding to the integrated circuit, performs an optical proximity correction (OPC) process to the first mask layout to produce a first corrected mask layout, and performs an inverse lithographic technology (ILT) process to the first corrected mask layout to enhance the first corrected mask layout to produce a first OPC-ILT enhanced mask layout. The system also includes a convolutional neural network that generates a first IC layout as an IC layout when the first OPC-ILT-enhanced mask layout is projected on a wafer. The system also includes a mask verifier module that inspects the first IC layout on the wafer to verify that the first IC layout does not have defects. In an embodiment, the generated first IC layout includes one or more parameters associated with the first IC layout. The mask verifier module verifies that the one or more parameters are within a process window. The process window includes a threshold range of radiation energy for generating the first IC layout and a depth of focus threshold range for the generated first IC layout. In an embodiment, the system further includes a training module that receives a plurality of OPC-ILT-enhanced mask layouts, stores the plurality of OPC-ILT-enhanced mask layouts and the corresponding IC layouts in a database in a memory of the system, performs a training of the convolutional neural network based on a first portion of the database. The OPC-ILT-enhanced mask layouts of the first portion are inputs of the convolutional neural network and the corresponding IC layouts are outputs of the convolutional neural network. The training module also performs a verification of the convolutional neural network based on a remaining second portion of the database. The OPC-ILT-enhanced mask layouts of the second portion are inputs of the convolutional neural network and the corresponding IC layouts are outputs of the convolutional neural network. In an embodiment, the system further includes a mask design module coupled to the OPC-ILT enhancer module and to generate the first mask layout for the OPC-ILT enhancer module. In an embodiment, the system further includes a mask projection system to use a radiation source to project the first OPC-ILT-enhanced mask layout on a mask-blank to produce the lithographic mask. In an embodiment, the database does not include the first OPC-ILT-enhanced mask layout.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a lithographic mask for an integrated circuit, comprising:
   performing an optical proximity correction (OPC) process to an integrated circuit mask layout to produce a corrected mask layout;
   performing an inverse lithographic technology (ILT) process to the corrected mask layout to enhance the corrected mask layout to produce an OPC-ILT-enhanced mask layout;
   generating, as an output of a convolutional neural network and based on the OPC-ILT-enhanced mask layout, a first pattern as a pattern when the OPC-ILT-enhanced mask layout is projected on a wafer;
   inspecting the first pattern to verify the OPC-ILT-enhanced mask layout;
   wherein prior to the verifying the OPC-ILT-enhanced mask layout:
      generating a database, comprising:
         generating a plurality of integrated circuit mask layouts;
         performing one or more OPC-ILT enhancements on each one of the plurality of integrated circuit mask layouts to produce OPC-ILT-enhanced mask layouts;
         performing mask projection of each one of the OPC-ILT-enhanced mask layouts to generate a corresponding pattern; and
         storing the OPC-ILT-enhanced mask layouts and the corresponding patterns in the database stored in a storage memory;
      training the convolutional neural network based on a first portion of the database, wherein OPC-ILT-enhanced mask layouts are inputs of the convolutional neural network and the corresponding patterns are outputs of the convolutional neural network; and
      verifying the convolutional neural network based on a remaining second portion of the database.

2. The method of claim 1, wherein the generated first pattern comprises one or more parameters of the first pattern, and wherein the verifying the OPC-ILT-enhanced mask layout further comprises:

verifying the one or more parameters are within a process window, wherein the process window comprises a threshold range of radiation energy for generating the first pattern and a depth of focus threshold range for the generated first pattern.

3. The method of claim 2, further comprising:
performing two or more mask projections for each one of the OPC-ILT-enhanced mask layouts to generate two or more corresponding patterns for each one of the OPC-ILT-enhanced mask layouts, wherein the two or more mask projections have different exposure doses and different depth of focus conditions.

4. The method of claim 3, wherein the first pattern comprises a corresponding exposure dose and a corresponding depth of focus for generating the first pattern, the method further comprising:
verifying the corresponding exposure dose and the corresponding depth of focus are within the process window.

5. The method of claim 1, wherein the verifying the first pattern does not generate defects when verifying a probability of generating a defect in the first pattern is below a first threshold level.

6. The method of claim 1, wherein the integrated circuit mask layout comprises a graphic design system (GDS) file, and wherein the OPC-ILT-enhanced mask layout comprises an adjusted GDS file.

7. The method of claim 1, wherein the performing the mask projection is a simulation projection.

8. The method of claim 1, further comprising:
performing another OPC process and or another ILT process to the integrated circuit mask layout to produce another OPC-ILT-enhanced mask layout; and
verifying the another OPC-ILT-enhanced mask layout using the convolutional neural network.

9. The method of claim 1, wherein the inspecting the first pattern comprises:
verifying that the first pattern does not generate defects.

10. A method for manufacturing a lithographic mask for an integrated circuit, comprising:
performing an optical proximity correction (OPC) process to a mask layout corresponding the integrated circuit to produce a corrected mask layout;
performing an inverse lithographic technology (ILT) process to the corrected mask layout to enhance the corrected mask layout to produce an OPC-ILT-enhanced mask layout;
generating, as an output of a convolutional neural network and based on the OPC-ILT-enhanced mask layout, a first pattern as a pattern when the OPC-ILT-enhanced mask layout is projected on a wafer;
inspecting the first pattern to verify the OPC-ILT-enhanced mask layout; and
if the OPC-ILT-enhanced mask layout is not verified, continue the performing the OPC process, the ILT process, and the generating until the OPC-ILT-enhanced mask layout is verified,
wherein the first pattern comprises one or more parameters of the first pattern, and wherein the verifying the OPC-ILT-enhanced mask layout further comprises:
verifying the one or more parameters are within a process window, wherein the process window comprises a threshold range of radiation energy for generating the first pattern and a depth of focus threshold range for the first pattern.

11. The method of claim 10, further comprising:
receiving the mask layout from a mask design module, wherein the mask layout is a photomask layout.

12. The method of claim 10, wherein the inspecting the first pattern comprises:
verifying that the first pattern does not generate defects.

13. The method of claim 10, further comprising:
performing another OPC process and or another ILT process to the integrated circuit mask layout to produce another OPC-ILT-enhanced mask layout; and
verifying the another OPC-ILT-enhanced mask layout using the convolutional neural network.

14. The method of claim 10, wherein prior to the verifying the OPC-ILT-enhanced mask layout:
generating a database, comprising:
generating a plurality of integrated circuit mask layouts;
performing one or more OPC-ILT enhancements on each one of the plurality of integrated circuit mask layouts to produce OPC-ILT-enhanced mask layouts;
performing mask projection of each one of the OPC-ILT-enhanced mask layouts to generate a corresponding pattern; and
storing the OPC-ILT-enhanced mask layouts and the corresponding patterns in the database stored in a storage memory;
training the convolutional neural network based on a first portion of the database, wherein OPC-ILT-enhanced mask layouts are inputs of the convolutional neural network and the corresponding patterns are outputs of the convolutional neural network; and
verifying the convolutional neural network based on a remaining second portion of the database.

15. A system for manufacturing a lithographic mask for an integrated circuit, comprising:
an OPC-ILT enhancer module configured to:
receive a first mask layout corresponding to the integrated circuit;
perform an optical proximity correction (OPC) process to the first mask layout to produce a first corrected mask layout; and
perform an inverse lithographic technology (ILT) process to the first corrected mask layout to enhance the first corrected mask layout to produce a first OPC-ILT-enhanced mask layout;
a convolutional neural network configured to:
generate a first pattern as a pattern when the first OPC-ILT-enhanced mask layout is projected on a wafer; and
a mask verifier module configured to:
inspect the first pattern on the wafer to verify that the first pattern does not have defects, wherein the generated first pattern comprises one or more parameters associated with the first pattern, wherein the mask verifier module is further configured to verify the one or more parameters are within a process window, and wherein the process window comprises a threshold range of radiation energy for generating the first pattern and a depth of focus threshold range for the generated first pattern.

16. The system of claim 15, further comprising a training module configured to:
receive a plurality of OPC-ILT-enhanced mask layouts;
receive patterns corresponding to each one of the OPC-ILT-enhanced mask layouts;
store the plurality of OPC-ILT-enhanced mask layouts and the corresponding patterns in a database in a memory of the system;

perform a training of the convolutional neural network based on a first portion of the database, wherein OPC-ILT-enhanced mask layouts of the first portion are inputs of the convolutional neural network and the corresponding patterns are outputs of the convolutional neural network; and perform a verification of the convolutional neural network based on a remaining second portion of the database, wherein OPC-ILT-enhanced mask layouts of the second portion are inputs of the convolutional neural network and the corresponding patterns are outputs of the convolutional neural network.

17. The system of claim 16, wherein the database does not include the first OPC-ILT-enhanced mask layout.

18. The system of claim 15, further comprising:
a mask design module coupled to the OPC-ILT enhancer module and configured to generate the first mask layout for the OPC-ILT enhancer module.

19. The system of claim 15, further comprising:
a mask projection system configured to use a radiation source to project the first OPC-ILT-enhanced mask layout on a mask-blank to produce the lithographic mask.

20. The system of claim 15, wherein the first pattern comprises a corresponding radiation energy and a corresponding depth of focus for generating the first pattern, and wherein the mask verifier module is further configured to:
verify the corresponding radiation energy and the corresponding depth of focus are within the process window.

* * * * *